(12) United States Patent
Hira et al.

(10) Patent No.: US 9,748,919 B2
(45) Date of Patent: Aug. 29, 2017

(54) ELASTIC WAVE DEVICE

(71) Applicant: Murata Manufacturing Co., Ltd., Nagaokakyo-shi, Kyoto-fu (JP)

(72) Inventors: Mitsuyoshi Hira, Nagaokakyo (JP); Motoji Tsuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 208 days.

(21) Appl. No.: 14/699,007

(22) Filed: Apr. 29, 2015

(65) Prior Publication Data

US 2015/0249438 A1    Sep. 3, 2015

Related U.S. Application Data

(63) Continuation of application No. PCT/JP2013/080524, filed on Nov. 12, 2013.

(30) Foreign Application Priority Data

Nov. 13, 2012  (JP) ................. 2012-249157

(51) Int. Cl.
*H03H 9/10* (2006.01)
*H03H 9/05* (2006.01)
*H01L 41/053* (2006.01)
*H03H 9/02* (2006.01)

(52) U.S. Cl.
CPC ....... *H03H 9/1085* (2013.01); *H01L 41/0533* (2013.01); *H03H 9/02992* (2013.01); *H03H 9/059* (2013.01); *H03H 9/1071* (2013.01); *H03H 9/1092* (2013.01)

(58) Field of Classification Search
CPC ............... H03H 9/17; H03H 9/25; H03H 9/64
USPC ..................................... 310/344, 348
See application file for complete search history.

(56) References Cited

U.S. PATENT DOCUMENTS

| 2001/0001293 | A1  | 5/2001  | Gotoh et al. |
| 2005/0104685 | A1  | 5/2005  | Kuroki et al. |
| 2010/0301708 | A1* | 12/2010 | Tsuda ............. H03H 9/059 310/344 |
| 2011/0084573 | A1* | 4/2011  | Yamaji ........... H03H 9/1092 310/340 |

(Continued)

FOREIGN PATENT DOCUMENTS

| JP | 10-163796 A | 6/1998 |
| JP | 11-251866 A | 9/1999 |

(Continued)

OTHER PUBLICATIONS

Official Communication issued in International Patent Application No. PCT/JP2013/080524, mailed on Feb. 4, 2014.

*Primary Examiner* — J. San Martin
(74) *Attorney, Agent, or Firm* — Keating & Bennett, LLP

(57) ABSTRACT

An elastic wave device includes a piezoelectric substrate, an IDT electrode, and a cover member. The IDT electrode is provided on the piezoelectric substrate. The cover member is provided above the piezoelectric substrate and separate from the IDT electrode. The cover member includes a first cover member and a second cover member. The second cover member is laminated on a side of the first cover member opposite to the piezoelectric substrate. The glass transition point of the first cover member is higher than that of the second cover member.

8 Claims, 1 Drawing Sheet

(56) References Cited

U.S. PATENT DOCUMENTS

| | | | |
|---|---|---|---|
| 2011/0221546 A1* | 9/2011 | Yamaji | H03H 9/1071 |
| | | | 333/193 |
| 2012/0086309 A1* | 4/2012 | Yamaji | H03H 9/1092 |
| | | | 310/313 B |
| 2012/0223789 A1* | 9/2012 | Inoue | H01L 41/053 |
| | | | 333/193 |
| 2013/0335171 A1 | 12/2013 | Yamato et al. | |
| 2015/0243875 A1* | 8/2015 | Hira | H03H 9/1085 |
| | | | 310/313 B |

FOREIGN PATENT DOCUMENTS

| | | |
|---|---|---|
| JP | 2000-049247 A | 2/2000 |
| JP | 2002-217673 A | 8/2002 |
| JP | 2003-152453 A | 5/2003 |
| JP | 2005-129855 A | 5/2005 |
| JP | 2007-258776 A | 10/2007 |
| JP | 2007-266865 A | 10/2007 |
| JP | 2008-187451 A | 8/2008 |
| JP | 2009-200996 A | 9/2009 |
| JP | 2009-213174 A | 9/2009 |
| JP | 2010-193487 A | 9/2010 |
| JP | 2010-278972 A | 12/2010 |
| JP | 4811232 B2 | 11/2011 |
| WO | 2012/120968 A1 | 9/2012 |

* cited by examiner

ELASTIC WAVE DEVICE

BACKGROUND OF THE INVENTION

1. Field of the Invention

The present invention relates to elastic wave devices and elastic wave module devices.

2. Description of the Related Art

Elastic wave devices such as surface acoustic wave devices have been widely used in filters and the like, for example. Japanese Patent No. 4811232 discloses a surface acoustic wave device including a piezoelectric substrate on the surface of which an IDT (interdigital transducer) electrode is provided, and a cover member provided above the piezoelectric substrate so as to cover the IDT electrode. It is disclosed in Japanese Patent No. 4811232 that a protection member whose elastic modulus is smaller than that of a mold resin is provided on the cover member so as to increase durability against the pressure impact applied to the surface acoustic wave device during molding of the surface acoustic wave device to be used in an elastic wave module device.

Also in the surface acoustic wave device disclosed in Japanese Patent No. 4811232, there is a case where the cover member is deformed by the pressure applied thereto during the molding resulting in making contact with the IDT electrode or the like, whereby there arises a problem that the IDT electrode is damaged and so on.

SUMMARY OF THE INVENTION

Preferred embodiments of the present invention to provide elastic wave devices and elastic wave module devices having excellent pressure resistance.

An elastic wave device according to a preferred embodiment of the present invention includes a piezoelectric substrate, an IDT electrode, and a cover member. The IDT electrode is provided on the piezoelectric substrate. The cover member is provided above the piezoelectric substrate while being separate from the IDT electrode. The cover member includes a first cover member and a second cover member. The second cover member is laminated on a side of the first cover member opposite to the piezoelectric substrate. The glass transition point of the first cover member is higher than that of the second cover member.

According to a specific aspect of an elastic wave device according to various preferred embodiments of the present invention, a difference in glass transition point between the first cover member and the second cover member is not less than about 80° C., for example.

According to another specific aspect of an elastic wave device according to various preferred embodiments of the present invention, the glass transition point of the first cover member is not less than about 180° C. and the glass transition point of the second cover member is not more than about 100° C., for example.

According to still another specific aspect of an elastic wave device according to various preferred embodiments of the present invention, the first cover member includes a polyimide resin and the second cover member includes an epoxy resin.

An elastic wave module device according to a preferred embodiment of the present invention includes a wiring substrate, the elastic wave device that is configured according to another preferred embodiment of the present invention and mounted on the wiring substrate, and a mold resin layer provided on the wiring substrate so as to cover the elastic wave device. The glass transition point of the mold resin layer preferably is lower than any of the glass transition points of the first cover member and the second cover member.

In a specific aspect of an elastic wave module device according to various preferred embodiments of the present invention, a coefficient of linear expansion of the mold resin layer is smaller than any of the coefficients of linear expansion of the first cover member and the second cover member, and larger than the coefficient of linear expansion of the wiring substrate.

In another broad aspect of an elastic wave module device according to various preferred embodiments of the present invention, the elastic wave module device includes a wiring substrate, the elastic wave device that is configured according to another preferred embodiment of the present invention and mounted on the wiring substrate, and a mold resin layer provided on the wiring substrate so as to cover the elastic wave device. The coefficient of linear expansion of the mold resin layer is smaller than any of the coefficients of linear expansion of the first cover member and the second cover member, and larger than the coefficient of linear expansion of the wiring substrate.

According to various preferred embodiments of the present invention, elastic wave devices and elastic wave module devices having excellent pressure resistance are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
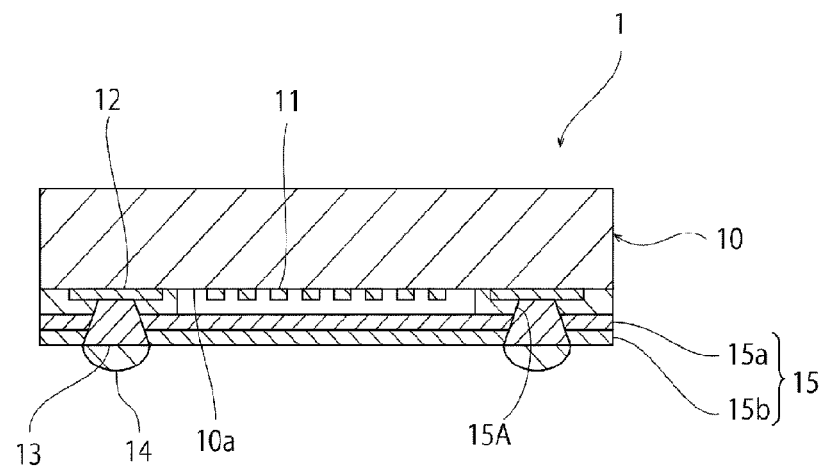
FIG. 1 is a schematic cross-sectional view illustrating an elastic wave device according to a preferred embodiment of the present invention.

Hereinafter, examples of preferred embodiments of the present invention will be described. It is to be noted that the following preferred embodiments are merely examples. The present invention is not intended to be limited to the following preferred embodiments in any way.

In the drawings referred to in the preferred embodiments and the like, members having functions that are the same or substantially the same will be referred to as the same reference numerals. Further, the drawings referred to in the description of the preferred embodiments of the present invention and the like are schematically depicted. As such, the ratios of dimensions and so on of objects depicted in the drawings may differ from the actual ratios of dimensions and so on of those objects. The ratios of dimensions and so on of the objects may differ from drawing to drawing as well. The specific ratios of dimensions and so on of objects should be understood in consideration of the following descriptions.

FIG. 1 is a schematic cross-sectional view illustrating an elastic wave device according to a preferred embodiment of the present invention. Specifically, an elastic wave device 1 shown in FIG. 1 is a surface acoustic wave device making use of surface acoustic waves. The elastic wave device 1 includes a piezoelectric substrate 10. The piezoelectric substrate 10 can be configured with a material of piezoelectricity such as $LiNbO_3$, $LiTaO_3$, crystal, zinc oxide, or the like. Further, the piezoelectric substrate 10 may be configured with a carrier made of a material of non-piezoelectricity and a piezoelectric layer disposed on the carrier.

On a principal surface 10a of the piezoelectric substrate 10, there are provided at least one IDT electrode 11 and a pad electrode 12 to which the IDT electrode is electrically connected. The IDT electrode 11 can be configured with at least one type of material among Al, Pt, Au, Ag, Cu, Ni, Ti, Cr, and Pd, for example.

A cover member 15 is provided above the principal surface 10a of the piezoelectric substrate 10 via a support layer. The cover member 15 is so provided as to cover the IDT electrode 11. The cover member 15 is provided separate from the IDT electrode 11. In other words, a gap is provided between the cover member 15 and the IDT electrode 11. The perimeter of the cover member 15 is connected to the piezoelectric substrate 10. With this, a region on the piezoelectric substrate 10 where the IDT electrode is provided is sealed.

The cover member 15 is configured with a multilayer body including a plurality of cover members including a first cover member 15a and a second cover member 15b. The second cover member 15b is laminated on a side of the first cover member 15a opposite to the piezoelectric substrate 10. In other words, the first cover member 15a is relatively positioned on a piezoelectric substrate 10 side while the second cover member 15b is relatively positioned on the side opposite to the piezoelectric substrate 10. The first cover member 15a and the second cover member 15b are each configured with a resin having its own glass transition point. The glass transition point of the first cover member 15a is higher than the glass transition point of the second cover member 15b.

A via hole 15A extending to the pad electrode 12 is provided in the cover member 15. An under-bump metal 13 is provided inside the via hole 15A. A bump electrode 14 is provided on the under-bump electrode 13.

Figure 2:
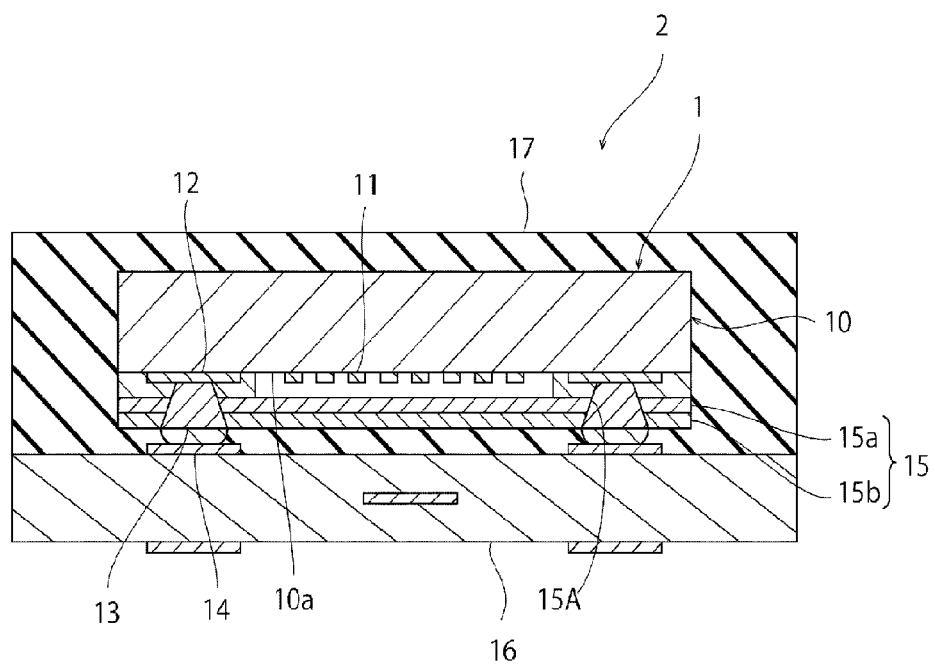
FIG. 2 is a schematic cross-sectional view illustrating an elastic wave module device according to a preferred embodiment of the present invention.

The elastic wave device 1 is used in an elastic wave module device 2 as shown in FIG. 2, for example. The elastic wave module device 2 is provided with a wiring substrate 16. The elastic wave device 1 is mounted on the wiring substrate 16 using a flip-chip mounting technique. A mold resin layer 17 is provided on the wiring substrate 16. The mold resin layer 17 can be configured with, for example, a silicone-based resin.

In manufacturing the elastic wave module device 2, a process of mounting the elastic wave device 1 on the wiring substrate 16 is carried out first. Thereafter, the wiring substrate 16 on which the elastic wave device 1 is mounted is held in a mold, and a resin molding process of injecting a heated resin material into the mold, and so on, is carried out, whereby the mold resin layer 17 is formed. By carrying out these processes, the elastic wave module device 2 is completed. It is preferable for the temperature of the heated resin material during the molding to be about 120° C. to about 200° C., and more preferable to be about 150° C. to about 180° C., for example. Note that it is preferable for the temperature during the molding to be not less than the glass transition point or the melting point of the resin material forming the mold resin layer 17.

Pressure is applied to the elastic wave device when the mold resin layer is formed during the resin molding process. This raises a risk that the cover member is deformed so as to make contact with the IDT electrode or the like. If the cover member makes contact with the IDT electrode or the like, there arises a risk that the IDT electrode or the like is damaged.

Here, in the elastic wave device 1, the glass transition point of the first cover member 15a is higher than that of the second cover member 15b. Even if pressure and heat are applied to the elastic wave device 1 during the molding, of the first and second cover members 15a and 15b, the first cover member 15a positioned on the IDT electrode side has a higher glass transition point than the second cover member 15b positioned on the opposite side to the IDT electrode. As such, in the case where the temperature of the elastic wave device 1 rises, an amount of deformation of the first cover member 15a is smaller than that of the second cover member 15b. This makes it difficult for the first cover member 15a to make contact with the IDT electrode. Meanwhile, the second cover member 15b which is positioned on the opposite side to the IDT electrode and is in contact with the mold resin layer 17, reaches a temperature near the glass transition point earlier than the first cover member 15a due to the heat received from the mold resin layer 17. As a result, the second cover member 15b deforms larger than the first cover member 15a due to the heat and pressure during the molding. The pressure that is applied to the cover member 15 during the molding is dispersed by the deformation of the second cover member 15b. As a result, the IDT electrode and the like are unlikely to be damaged due to the contact with the first cover member 15a. As such, the elastic wave device 1 is excellent in pressure resistance.

In view of realizing more excellent pressure resistance, it is preferable for the glass transition point of the first cover member 15a to be higher than that of the second cover member 15b by not less than about 80° C., for example. This is because an amount of deformation of the first cover member 15a is able to be made relatively smaller than that of the second cover member 15b when the temperature rises. It is preferable for the glass transition point of the first cover member 15a to be not less than about 180° C., and for the glass transition point of the second cover member 15b to be not more than about 100° C., for example.

The first cover member 15a preferably is configured with, for example, a resin in which silicone-based rubber is added to a polyimide resin whose glass transition point is about 200° C., for example. The second cover member 15b preferably is configured with, for example, a resin in which a filler is added to an epoxy resin whose glass transition point is about 100° C., for example, which is a temperature equal to or less than the temperature during the molding. The support layer preferably is configured with a polyimide resin.

Note that the first cover member 15a and the second cover member 15b may directly make contact with each other, or another layer may be interposed between the first cover member 15a and the second cover member 15b.

As shown in FIG. 2, the elastic wave device 1 is mounted on the wiring substrate 16 in the elastic wave module device 2. Thereafter, the mold resin layer 17 is formed by carrying out the resin molding process while heating the resin material, such that the elastic wave module device 2 is completed. In this case, it is preferable to set the glass transition point of the mold resin layer 17 to be lower than any of the glass transition points of the first cover member 15a and the second cover member 15b. As a result, the temperature during the molding is able to be set to be lower. This prevents the first cover member 15a and the second cover member 15b from being softened due to the rise of temperature. As such, because amounts of deformation of the first cover member 15a and the second cover member 15b are made smaller, it is possible to prevent the first cover member 15a and the second cover member 15b of the elastic wave device 1 from interfering with the IDT due to their deformation.

In the elastic wave module device 2, the coefficient of linear expansion of the mold resin layer preferably is set smaller than any of the coefficients of linear expansion of the first cover member and the second cover member, and the coefficient of linear expansion of the mold resin layer 17 preferably is set larger than that of the wiring substrate 16. With this configuration, in the case where the temperature of the elastic wave device 1 sealed by the mold resin layer 17 changes, an amount of deformation of the wiring substrate 16, due to the temperature change, is able to be made intermediate between the amounts of deformation of the first cover member 15a and the second cover member 15b. Accordingly, stress caused by a difference in thermal shrinkage is alleviated.

It is to be noted that electronic components such as a chip inductor, a chip capacitor, a control IC, and so on may be mounted on the wiring substrate 16 of the elastic wave module device 2. In addition, these electronic components may be sealed by the mold resin layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device module comprising:
   a wiring substrate;
   an elastic wave device mounted on the wiring substrate, the elastic wave device comprising:
      a piezoelectric substrate;
      an IDT electrode that is provided on the piezoelectric substrate; and
      a cover member that is provided above the piezoelectric substrate and separate from the IDT electrode; wherein
      the cover member includes a first cover member and a second cover member that is laminated on a side of the first cover member opposite to the piezoelectric substrate; and
      a glass transition point of the first cover member is higher than a glass transition point of the second cover member; and
   a mold resin layer that is provided on the wiring substrate so as to cover the elastic wave device; wherein
   a glass transition point of the mold resin layer is lower than any of glass transition points of the first cover member and the second cover member.

2. The elastic wave device module according to claim 1, wherein a difference in glass transition point between the first cover member and the second cover member is not less than about 80° C.

3. The elastic wave device module according to claim 1, wherein
   a glass transition point of the first cover member is not less than 180° C.; and
   a glass transition point of the second cover member is not more than 100° C.

4. The elastic wave device module according to claim 1, wherein
   the first cover member includes a polyimide resin; and
   the second cover member includes an epoxy resin.

5. The elastic wave device module according to claim 1, wherein the elastic wave device is a surface acoustic wave device.

6. The elastic wave device module according to claim 1, further comprising a pad electrode on the piezoelectric substrate and electrically connected to the IDT electrode.

7. The elastic wave device module according to claim 6, further comprising a via hole provided in the cover member and extending to the pad electrode, and a metal provided inside of the via hole.

8. The elastic wave module device according to claim 1, wherein a coefficient of linear expansion of the mold resin layer is smaller than any of coefficients of linear expansion of the first cover member and the second cover member, and larger than a coefficient of linear expansion of the wiring substrate.

* * * * *